(12) United States Patent
Ma

(10) Patent No.: US 7,429,306 B2
(45) Date of Patent: Sep. 30, 2008

(54) PLASMA PROCESSING SYSTEM

(75) Inventor: Beom-Suk Ma, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 597 days.

(21) Appl. No.: 11/144,386

(22) Filed: Jun. 2, 2005

(65) Prior Publication Data
US 2005/0268850 A1  Dec. 8, 2005

(30) Foreign Application Priority Data
Jun. 2, 2004  (KR) ........................ 10-2004-0040029

(51) Int. Cl.
*C23F 1/00*  (2006.01)
(52) U.S. Cl. .............................. 156/345.26; 118/723 R
(58) Field of Classification Search ............ 315/111.01, 315/111.21; 156/345.26, 345.51, 345.22, 156/345.23; 204/298.31, 298.39; 118/723 R
See application file for complete search history.

(56) References Cited

U.S. PATENT DOCUMENTS

| | | | | |
|---|---|---|---|---|
| 5,534,751 A | * | 7/1996 | Lenz et al. ............. | 315/111.71 |
| 6,019,060 A | * | 2/2000 | Lenz ....................... | 118/723 R |
| 6,492,774 B1 | | 12/2002 | Han et al. ............... | 315/111.21 |
| 6,823,815 B2 | * | 11/2004 | Han et al. ................ | 118/723 E |
| 6,872,281 B1 | * | 3/2005 | Chen et al. ............. | 156/345.43 |
| 7,033,444 B1 | * | 4/2006 | Komino et al. ............... | 118/725 |
| 7,094,315 B2 | * | 8/2006 | Chen et al. ............. | 156/345.47 |
| 2005/0039682 A1 | * | 2/2005 | Dhindsa et al. .......... | 118/723 E |

FOREIGN PATENT DOCUMENTS

| | | |
|---|---|---|
| JP | 7-22388 | 1/1995 |
| KR | 2003-0066595 | 8/2003 |

OTHER PUBLICATIONS

English language abstract of the Japanese Publication No. 7-22388.
English language abstract of the Korean Publication No. 2003-0066595.

* cited by examiner

*Primary Examiner*—Thuy Vinh Tran
(74) *Attorney, Agent, or Firm*—Marger Johnson & McCollom, P.C.

(57) ABSTRACT

A plasma processing system includes a plasma processing chamber and a plasma confining portion for defining a plasma confined area in the processing chamber. The plasma confining portion includes a plurality of spaced-apart segments arranged in a structural array. An X-axis control portion is provided for moving the plasma confining portion in a direction to expand or contract the plasma confining area. The plasma confining portion typically includes a plurality of confining members disposed one another in a vertical plane and spaced from each other.

19 Claims, 8 Drawing Sheets

PLASMA PROCESSING SYSTEM

BACKGROUND OF THE INVENTION

This application claims the priority of Korean Patent Application No. 2004-40029, filed on Jun. 2, 2004, in the Korean Intellectual Property Office, the disclosure of which is incorporated herein in its entirety by reference.

1. Field of the Invention

The present invention relates to a plasma processing system, and more particularly, to a plasma processing system having a plasma confining portion that is designed to vary a plasma confined area.

2. Description of the Related Art

In the fabrication of a variety of semiconductor devices, a process for depositing layers of material and a process for etching the deposited layer in a predetermined pattern are required. The etching of the deposited layer may be accomplished by a variety of techniques including a plasma etching process. In the plasma etching process, plasma is formed from an etchant gas source. As the design rule becomes more constraining, process conditions for the plasma etching process varies according to processes, different types of plasma etching systems have accordingly been proposed.

Among the different types of plasma etching systems, a plasma etching system in which a confining ring defining a plasma area is disposed above an edge of a wafer has been proposed. An example of such a plasma etching system is disclosed in U.S. Pat. No. 6,492,774 B1. However, due to the structural limitation of the confining ring, the plasma etching system can be effectively applied only to a fixed plasma area.

FIG. 1 shows an exemplary plasma etching system with a typical confining ring. FIG. 2 more specifically depicts such a typical confining ring.

Referring to FIGS. 1 and 2, wafer support portion 25 for supporting a wafer 10 is installed in a wafer processing chamber. An upper electrode 21 is disposed beneath a chamber lid 23 opposite to a surface of the wafer 10. A lower electrode (not shown) may be disposed on a bottom of the wafer supporting portion 25.

The upper electrode 21 (or the lower electrode) is provided to form plasma from a reactive gas injected into the processing chamber. Radio frequency (RF) power may be applied to the upper electrode 21 (or/and the lower electrode) to form the plasma. The RF power applied on the lower electrode makes ions of plasma to be accelerated. Meanwhile, the wafer supporting portion 25 can be formed in a variety of designs to support and fix the wafer 10. For example, the wafer supporting portion may be designed in an electrostatic chunk (ESC).

A confining portion 30 is disposed above an edge region of the wafer 10 to confine the plasma above an area of the wafer 10. That is, the confining portion 30 functions to define an area of the plasma and control the etchant gas pressure. At this point, since the confining portion 30 is fixed when being viewed in a direction of an X-axis, a plasma confining area 27 is confined in a fixed range on the X-axis.

That is, even when the confining portion is comprised of a plurality of confining rings 31, 33 and 35 spaced away from each other and aligned in a direction of a Y-axis, since each confining ring 31 (33 and 35) is limited to a fixed ring-shape structure as shown in FIG. 2, the configuration of inner area 28 of the confining ring 31 are not varied but fixed. This means that an X-axis range of the plasma confining area 27 is fixed.

As described above, when the confining portion 30 having the fixed confining rings 31, 33 and 35 is used, it is impossible to vary the X-axis range of the plasma confining area 27. Therefore, a plasma confining area in the plasma etching system using the fixed confining portion 30 has to depend on the adjustment of the pressure in the plasma confining area 27 or a change of the material. The adjustment of the pressure may be possible by moving the confining rings 31, 33 and 35 in the direction of the Y-axis or varying a gap between the confining rings 31, 33 and 35.

However, the adjustment of the pressure in the plasma confining area 27 cannot fulfill a variety of conditions required during the etching process. The conditions required may be considered in accordance with each step of the etching process. Some of the required conditions may have a relationship trading off each other. Accordingly, when the confining condition is varied by moving the confining portion 30 only in the direction of the Y-axis (a vertical direction to the wafer 10), other property may be shifted, making it difficult to fulfill all different conditions required in the etching process.

For example, in a step of the etching process in which etch rate is an important consideration, it is preferable that plasma confinement be a priority. In a step of the etching process where uniformity is an important consideration, it is preferable that the plasma confining area 27 be relatively large. However, as shown in FIGS. 1 and 2, when the confining rings 31, 33 and 35 are designed in the fixed ring structure, since it is impossible to expand or contract the ring in the direction of the X-axis, it is also impossible to increase or reduce the plasma confining area 27.

As the design rule becomes more constrained, and a variety of process conditions are required in performing the plasma etching process, there is a need for a plasma etching system that can more freely adjust the plasma. That is, since different processing conditions are required for each step of the etching process, it becomes more essential to more freely vary the plasma confining area 27 for each step of the etching process. Particularly, it is now more necessary to freely expand or contract the inner area 28 of the confining ring 30.

SUMMARY OF THE INVENTION

The present invention provides a plasma processing system that can freely adjust a range of a plasma confining area by allowing a confining portion to expand or contract in a direction of an X-axis.

According to an aspect of the present invention, there is provided a plasma processing system including a plasma processing chamber and a plasma confining portion for defining a plasma confined area in the processing chamber. The plasma confining portion comprises a plurality of spaced apart segments arranged in a structural array. It also includes an X-axis control portion for moving the plasma confining portion in a direction to expand or contract the plasma confined area. Preferably, the plasma confining portion comprises a plurality of arc-shaped segments arranged to form a ring-like structural array; and the X-axis control portion moves the plasma confining portion in a radial direction to expand or contract the plasma confined area.

The plasma processing system may further include hangers for connecting the respective spaced-apart segments to the X-axis control portion.

The plasma processing system may further include a Y-axis control portion for vertically moving the plasma confining portion for controlling the pressure in the plasma confined area. The plasma processing system may further include a plurality of auxiliary segments disposed around the structural array defined by the spaced-apart segments to shield gaps defined between the spaced-apart segments. The auxiliary segments are spaced at a distance from the spaced-apart segments.

In another aspect of the present invention, there is provided a plasma processing system includes a plasma processing chamber, and a plasma confining portion comprising a plurality of confining members disposed one above another in a vertical plane and spaced away from each other, each of the confining members having a plurality of segments arranged in a structural array. A plurality of hangers can support the respective spaced-apart segments. A moving plate can support the hangers. The hangers can be provided with a plurality of guide slots, which are preferably formed in a radial direction. so that the hangers penetrate the guide slots. A plurality of hanger connecting members having first ends connected to the respective hangers can be slidable along the guide slots. A vertical fixing shaft can be connected to the second ends of the hanger connecting members. An X-axis control motor for sliding the hanger connecting members can move the vertical fixing shaft in a vertical direction and synchronously moving the spaced-apart segments in a radial direction to expand and contract the plasma confined area. A Y-axis control motor can be vertically move the arc-shaped segments by vertically moving the moving plate to control pressure in the plasma confined area.

According to the present invention, a range or area of the plasma confined area in a horizontal direction can be freely increased or reduced by varying the area defined by the plasma confining portion.

DETAILED DESCRIPTION OF THE PREFERRED EMBODIMENTS

Figure 1:
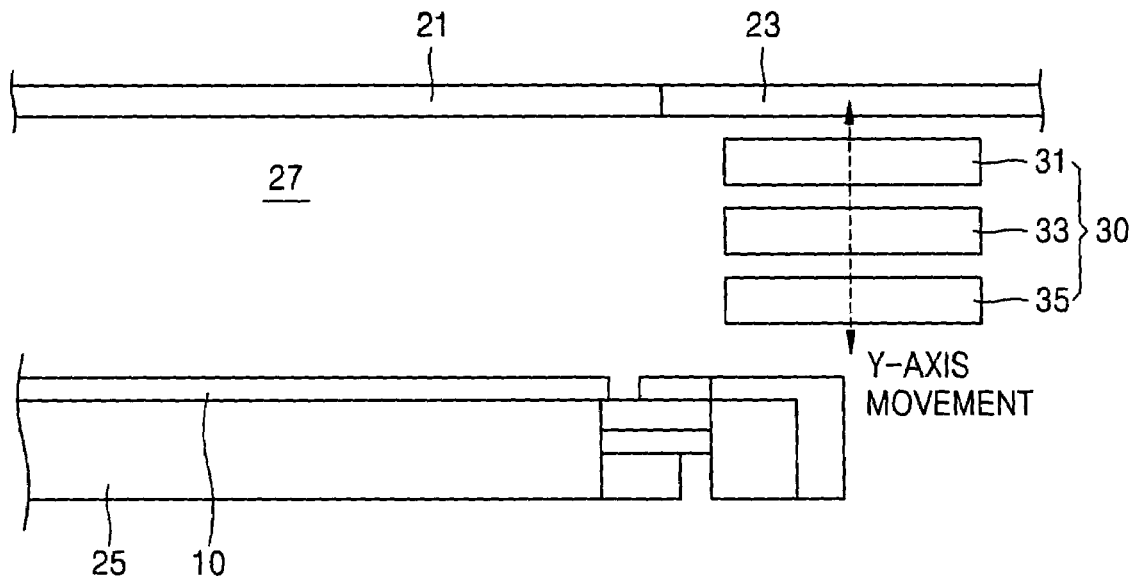
FIG. 1 is a schematic sectional view of a plasma etching system having a conventional confining ring.

The present invention will now be described more fully with reference to the accompanying drawings, in which exemplary embodiments of the invention are shown. The invention may, however, be embodied in many different forms and should not be construed as being limited to the embodiments set forth herein. Rather, these embodiments are provided so that this disclosure will be thorough and complete, and will fully convey the concept of the invention to those skilled in the art. In the drawings, the thicknesses of layers and regions are exaggerated for clarity.

In an embodiment of the present invention, a plasma confining portion is disposed above an edge or outer circumference of a wafer disposed in a vacuum process chamber. The plasma confining portion comprises a plurality of arc-shaped segments.

Figure 2:
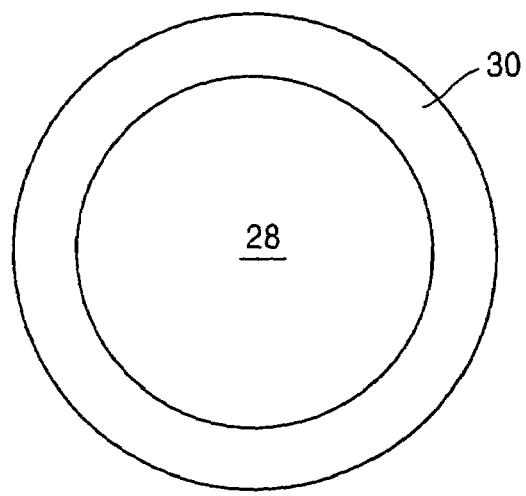
FIG. 2 is a plan view of a conventional confining ring.

The arc-shaped segments are spaced apart from each other at a predetermined distance to form a ring-like array. An area, which corresponds to an inner area of the ring-like array, can be increased or reduced by moving the arc-shaped segments in a direction of an X-axis (i.e., a direction parallel to a surface of the wafer or a radial direction). The conventional confining ring depicted in FIG. 2 is a fixed ring structure that cannot be expanded and contracted. However, in the present invention, since the plasma confining ring is formed by a plurality of arc-shaped segments, the confining ring can expand and contract by moving the segments in the radial direction.

Accordingly, a range of the plasma confined areas on the wafer can be freely increased or reduced by moving the segments in the radial direction in accordance with etching conditions required in each step of an etching process. For example, in the etching process wherein a predetermined etch rate should be maintained, and plasma confinement is an important criteria, the arc-shaped segments can be moved in the direction of the X-axis to reduce the plasma area. In a step of the etching process where uniformity should be maintained, the plasma confining area will be relatively large, and the arc-shaped segments can be moved in the direction of the X-axis to increase the plasma area.

Figure 3:
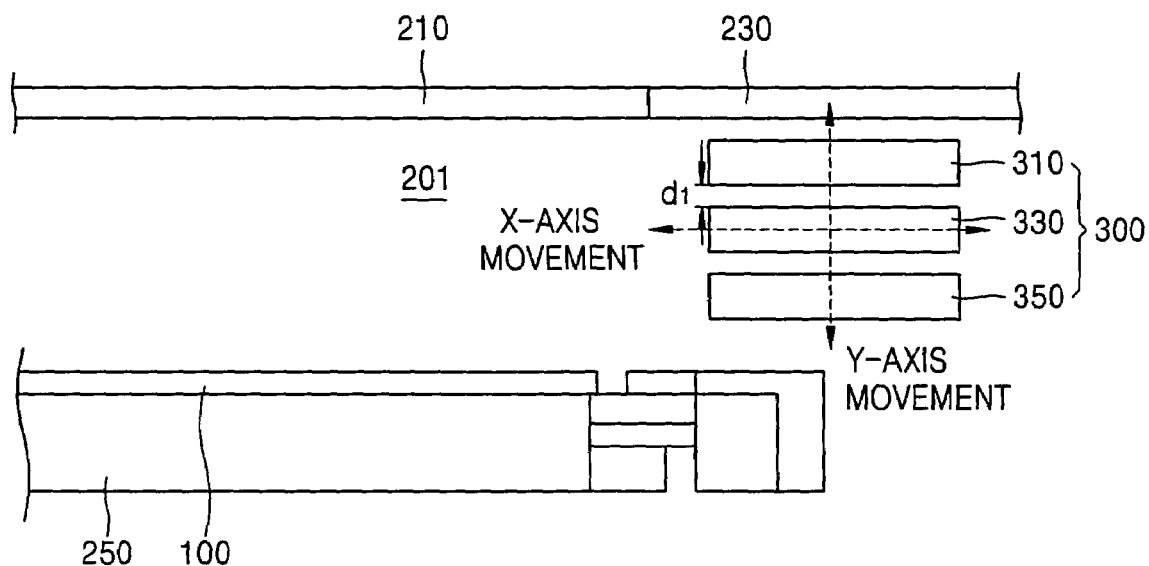
FIG. 3 is a schematic view of a plasma etching system having a plasma confining portion according to an embodiment of the present invention.
Figure 4:
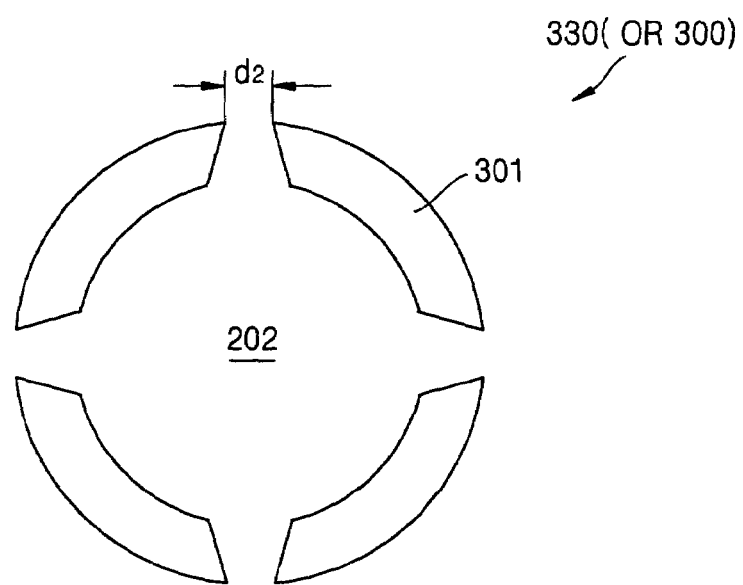
FIG. 4 is a plan view of an arrangement of arc-shaped segments of a plasma confining portion depicted in FIG. 3.

Referring to FIGS. 3 and 4, a wafer supporting portion 250, such as an ESC supporting a wafer 100, is installed in a vacuum process chamber. An upper electrode 210, which is disposed of a top lid 230 opposite a surface of a wafer 100 and a lower electrode (not shown), may be disposed on a bottom of the wafer supporting portion 250.

According to an embodiment of the present invention, as shown in FIG. 3, a plasma confining portion 300 can be disposed above an edge of the wafer 100 to confine plasma on an area of the wafer 100. The etchant gas induced into the processing chamber is exhausted out of the plasma confining portion 300. That is, the plasma confining portion 300 functions to define an area of the plasma and to control the etchant gas pressure in the area of the plasma by controlling etchant gas being exhausted.

The plasma confining portion 300 comprises a plurality of confining members 310, 330 and 350 that are disposed one above another, and are spaced away from each other by a distance d1 in a direction of a Y-axis vertical to the surface of the wafer 100. At this point, the distance d1 between the confining members 310, 330 and 350 may be adjusted by moving them in the direction of the Y-axis.

As shown in FIG. 4, each of the confining members 310, 330 and 350 is formed by a plurality of arc-shaped segments 301 that are spaced away from each other in a circumferential direction by a distance d2. The distances d1 and d2 set the pressure parameters controlling the pressure of a plasma confinement area 201. That is, the plasma confining portion 300 of the present invention can increase its pressure control parameters as compared with the prior plasma confining portion 30 which has conventional fixed confining rings 31, 32 and 33.

Each of the confining members 310, 330 and 350 is formed of the four arc-shaped segments 301, which preferably have a substantially identical size to each other. The arc-shaped segments are arranged to define a ring-like array. Although the arc-shaped segments 301 depicted in FIG. 4 are of a substantially identical size to each other, the present invention is not limited to this case.

As described above, since the plural arc-shaped segments 301 define a single ring-like array, the inner area 202 of the plasma confining portion 300 can be freely varied. That is, by moving the arc-shaped segments 301 outward or inward in the radial direction (i.e., in the direction of the X-axis) the inner area 202 of the plasma confining portion 300 can be increased or reduced.

The variation of the inner area 202 of the plasma confining portion 300 in turn means the variation of the plasma confining area 201. Therefore, since the plasma confinement area 201 can be properly varied in accordance with the conditions required in the etching process, a greater number of etching processes can be accomplished in a single plasma processing system.

Figure 5:
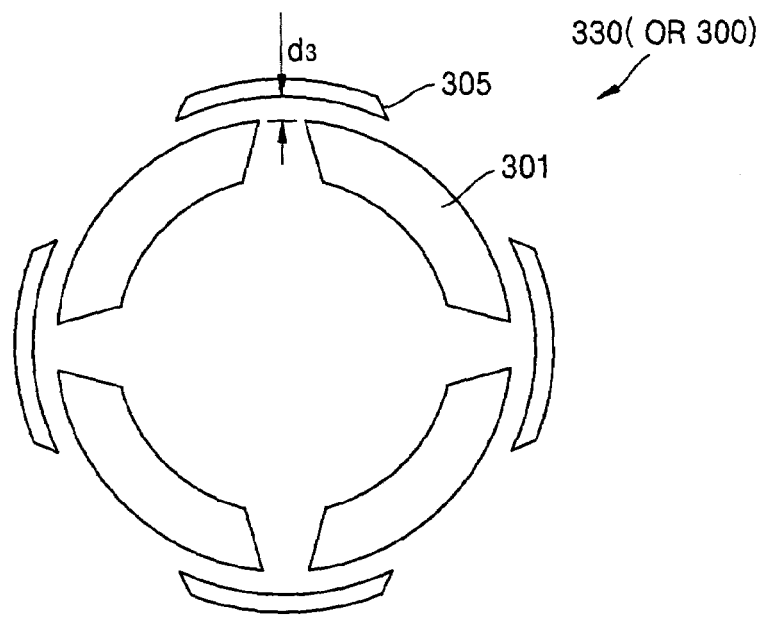
FIG. 5 is a plan view of a further arrangement of the plasma confining portion depicted in FIG. 4.

Alternatively, auxiliary segments 305 can be further disposed about the ring-like array defined by the segments 301 over the respective gaps between the segments 301, as shown in FIG. 5. The auxiliary segments 305 are also formed in an arc-shape and are arranged to form a circular array.

The distance between the arc-shaped segment 301 and the auxiliary segment 305 is d3. The distances d1, d2 and d3 are pressure regulators for controlling pressure within plasma confined area 201. That is, the plasma confining portion 300 of the present invention can vary the pressure control parameters within area 201 as compared with the prior plasma confining portion 30 has a conventional fixed confining rings 31, 32 and 33 and cannot vary the pressure within inner area 28.

Referring again to FIG. 3, the confining members 310, 330 and 350 are aligned in the direction of the Y-axis. At this point, each of the confining members 310, 330 and 350 are formed as proposed in FIG. 4 or FIG. 5. By moving the confining members 310, 330 and 350 in the direction of the Y-axis, the distances d1 between the confining members 310, 330 and 350 can be varied to adjust the pressure in the plasma confined area.

As described above, since each of the confining members 310, 330 and 350 are designed to freely be capable of moving in the direction of the X-axis as well as the Y-axis, the pressure of the plasma confinement area 201 as well as the wafer area defined by the plasma confinement area 201 can be properly varied in response to the conditions required in each step of the etching process.

Figure 6:
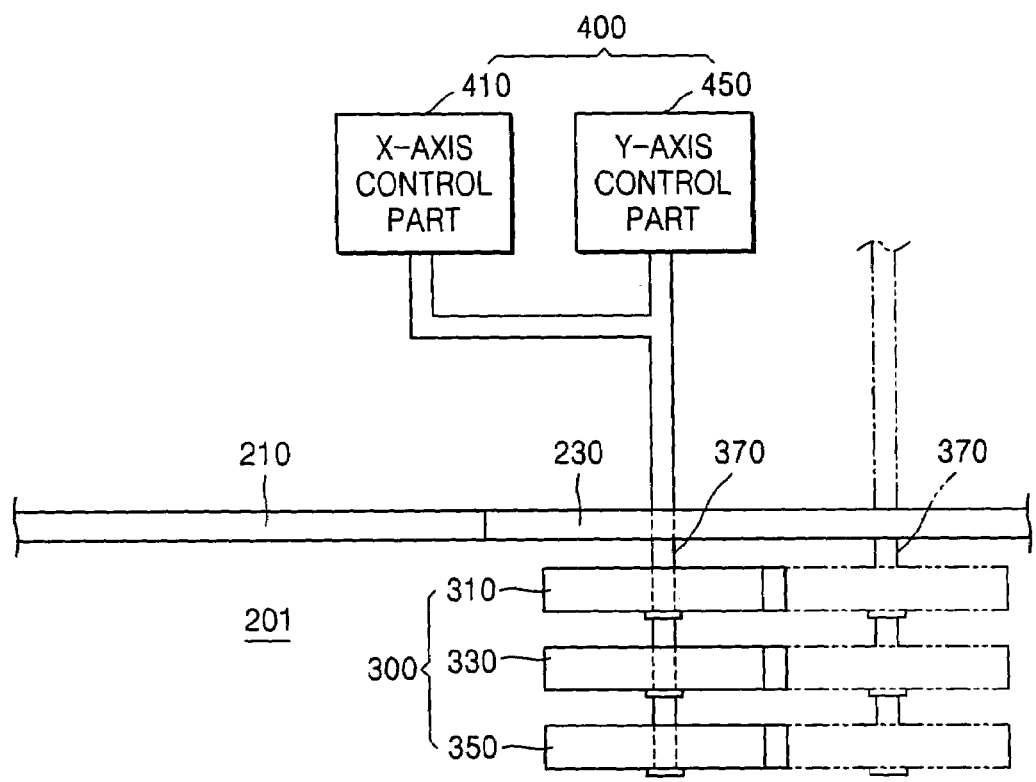
FIG. 6 is a schematic view illustrating a movement of a plasma confining portion in the direction of the X-axis according to an embodiment of the present invention.
Figure 7:
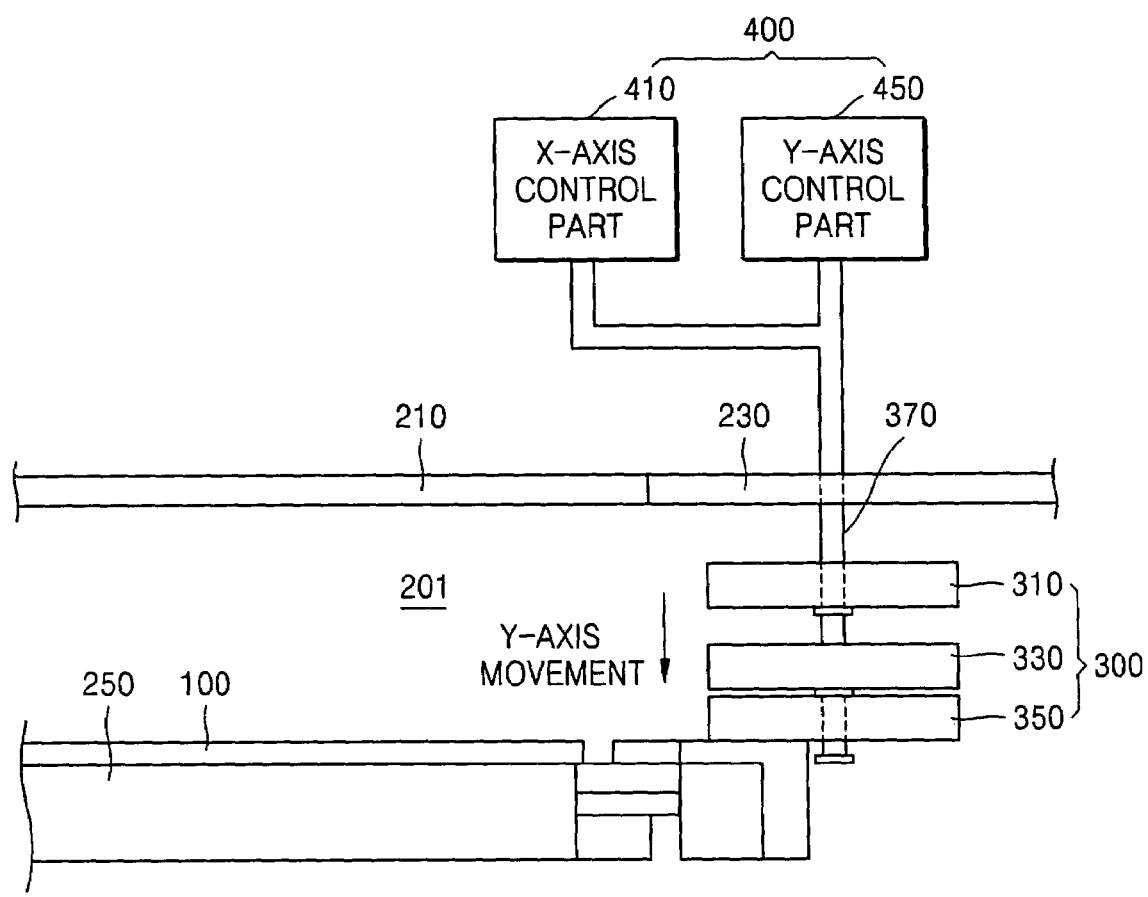
FIG. 7 is a schematic view illustrating a movement of a plasma confining portion in the direction of the Y-axis according to an embodiment of the present invention.

FIGS. 6 and 7 illustrate movements of a plasma confining portion in the directions of the X and Y-axes according to an embodiment of the present invention.

Referring to FIGS. 6 and 7, the movements of the plasma confining portion in the directions of the X and Y-axes are controlled by a position control portion 400. The position control portion 400 comprises an X-axis control portion 410 for controlling the movement of the plasma confining portion 30 in the direction of the X-axis and a Y-axis control portion 450 for controlling the movement of the plasma confining portion 300 in the direction of the Y-axis.

For example, as shown in FIG. 6, the confining members 310, 330 and 350 are fixed by holders or hangers 370 that are controlled by the X-axis control portion 410. Accordingly, each of the arc-shaped segments 301 and/or the auxiliary segments 305 is moved by a first driving portion (not shown) such as a step motor in accordance with the control operation of the X-axis control portion 410. The driving portion is installed on an exterior side of the processing chamber.

In addition, as shown in FIG. 7, the holders or hangers 370 are also controlled by the Y-axis control portion 450. Accordingly, each of the arc-shaped segments 301 and/or the auxiliary segments 305 is moved by a second driving portion such as a step motor in accordance with the control operation of the Y-axis control portion 450. The second driving portion is also installed on an exterior side of the processing chamber.

By the movement of the confining members 310, 330 and 350 in the direction of the Y-axis, as shown in FIG. 7, distances between the confining members 310, 330 and 350 can be varied.

Referring again to FIGS. 4, 5 and 6, when the confining members 310, 330 and 350 are moved by the X-axis control portion 410, the arc-shaped segments 301 of each confinement member can be independently or synchronously moved.

When the arc-shaped segments 301 of each confinement member can be independently moved in the direction of the X-axis, each of the arc-shaped segments 301 is connected to a respective independent step motor. The independent step motors are independently controlled by the X-axis control portion 410 to independently control an X-axis position of each of the arc-shaped segments 301 and/or the auxiliary segments 305.

Nevertheless, when considering the uniformity in the etching process, it is more preferable that the arc-shaped segments 301 and/or the auxiliary segments 305 are synchronously controlled. In this case, all of the segments 301 and/or 305 are connected to a single X-axis step motor.

Even when the segments 301 and/or 305 are designed to independently move in the direction of the X-axis, it is preferable that the segments 301 and/or 305 are synchronously moved in the direction of the Y-axis. In this case, all of the segments 301 and/or 305 are connected to a single Y-axis step motor.

Figure 8:
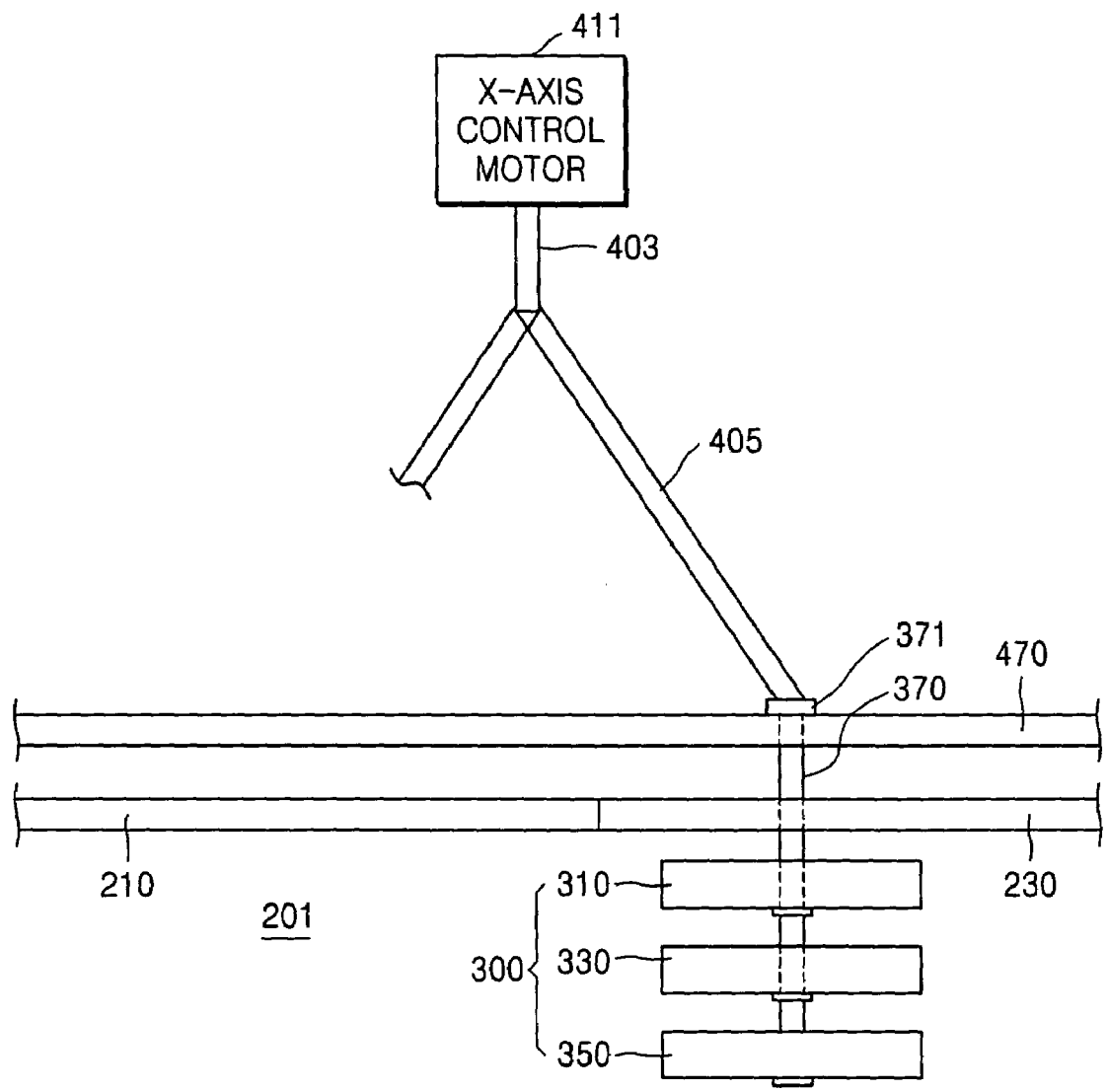
FIGS. 8 through 10 are views illustrating a moving plate for moving plasma confining portions in the direction of the X-axis according to an embodiment of the present invention.
Figure 9:
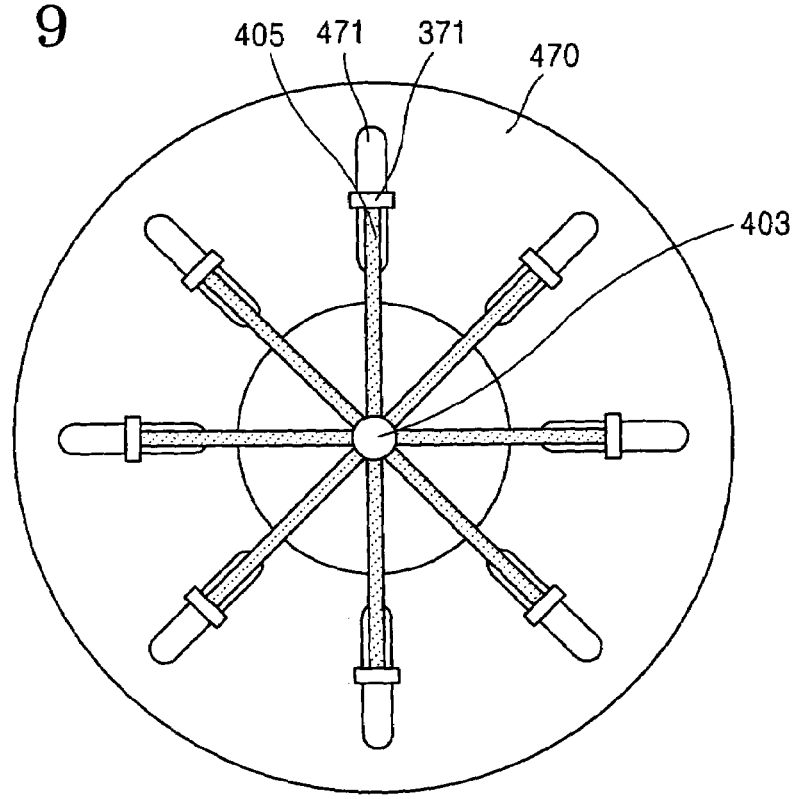
Figure 10:
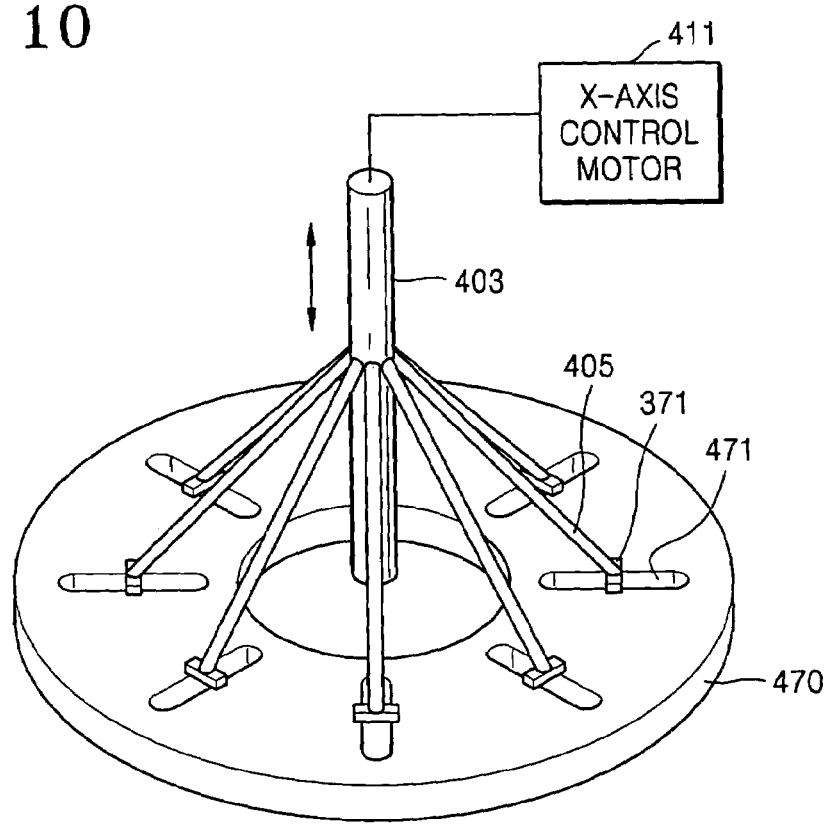
Figure 11A:
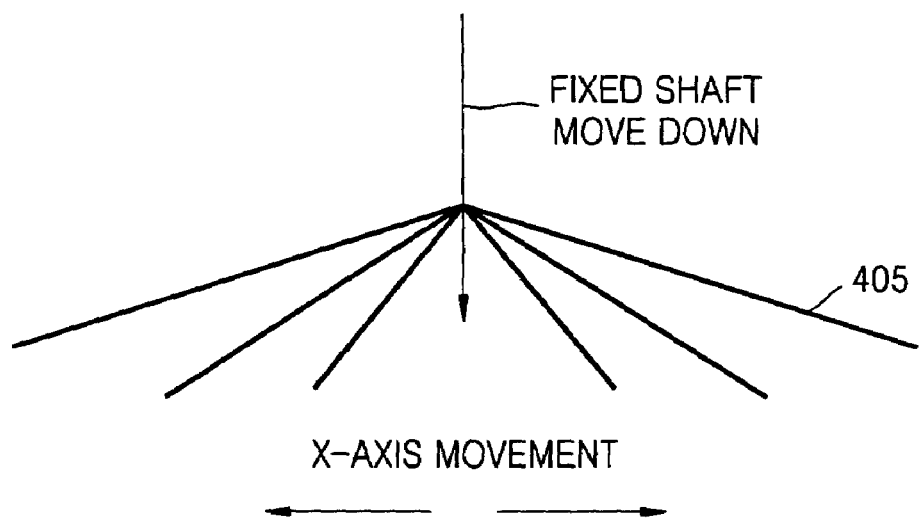
FIGS. 11a and 11b are views illustrating the synchronizing movement of arc-shaped segments and auxiliary segments, which form a plasma confining portion, according to an embodiment of the present invention.
Figure 11B:
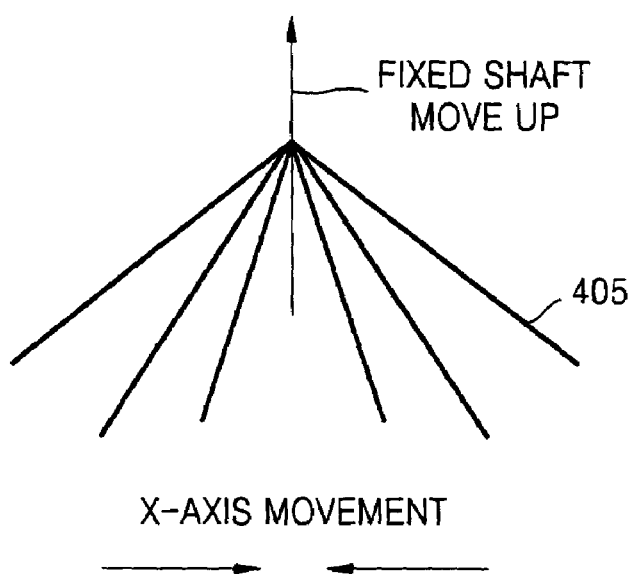
Figure 12:
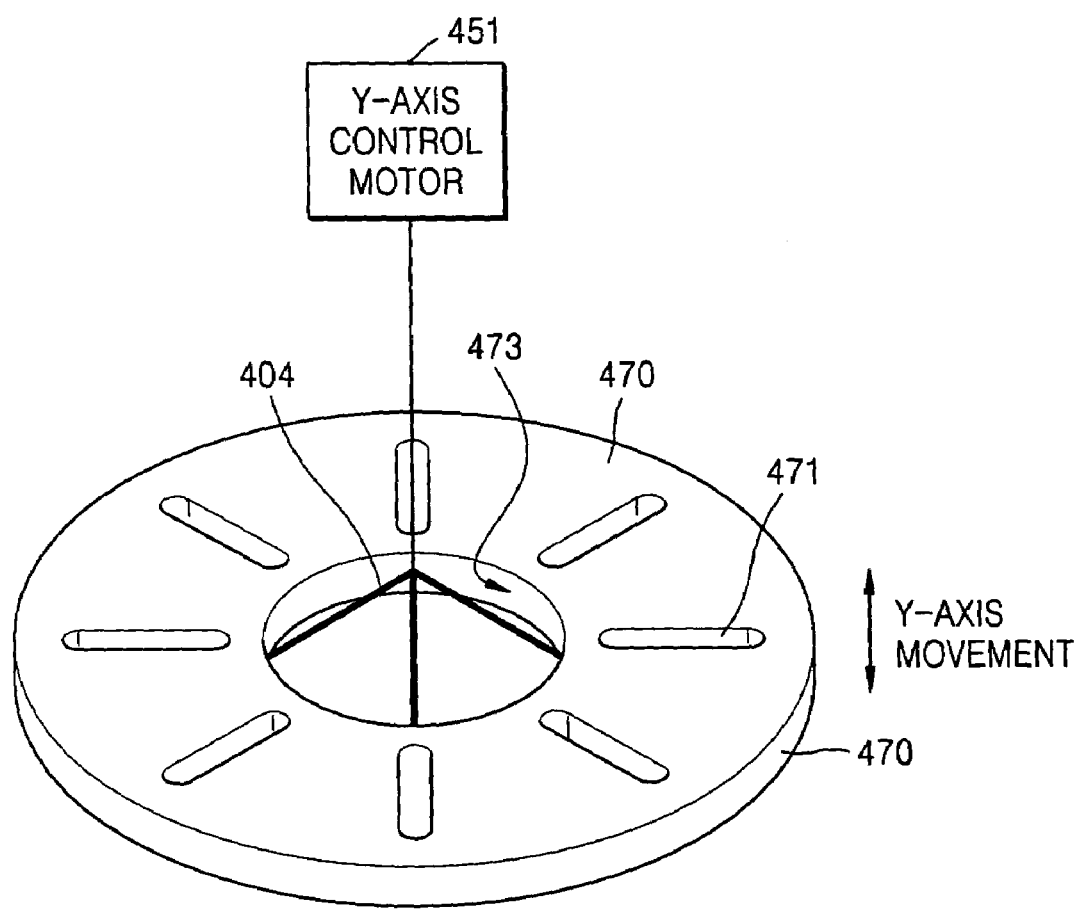
FIG. 12 is a schematic view illustrating a moving plate for moving a plasma confining portion in the direction of the Y-axis according to an embodiment of the present invention.

FIGS. 8 through 10 illustrate a moving plate for moving a plasma confining portion in the direction of the X-axis according to an embodiment of the present invention, FIGS. 11a and 11b illustrate a synchronizing movement of the arc-shaped segments and the auxiliary segments, which comprises the plasma confining portion, according to an embodiment of the present invention, and FIG. 12 illustrates a moving plate for moving the plasma confining portion in the direction of the Y-axis according to an embodiment of the present invention.

Referring to FIGS. 8 through 10 and 12, a moving plate 470 is provided so that the segments 301 and/or 305 can be and moved in the direction of the X-axis and/or Y-axis. As shown in FIG. 8, the moving plate 470 is provided above a reactor top 230 of the processing chamber. The hangers 370 are hooked on the moving plate 470, penetrating the reactor top 230. The penetration portion is sealed while allowing the hangers 370 to move in the direction of the X-axis. For example, this assembly can comprise a well-known sliding door structure.

Referring to FIGS. 8 and 9, the hangers 370 hooked on the moving plate 470 are connected to X-axis driving connecting shafts 405. For example, the hangers 370 penetrate the moving plate 470. The hangers 370 are connected to the respective X-axis driving shafts 405 by hanger connecting members 371. As shown in FIG. 9, the moving plate 470 may be formed of a ring-shaped plate, preferably fabricated of quartz or the like, provided with a plurality of guide slots 471 extending in a radial direction. The hangers 370 penetrate the guide slots 471 and the hanger connecting members 371 are hooked on the guide slots 471 to slide along the guide slots 471.

As depicted in FIG. 5, for example, since each of the confinement members 310, 330 and 350 of the plasma confining portion 300 is formed of the plural segments 301 and/or 305, the number of the hangers 370 is typically identical to that of the segments 301 and/or 305.

Referring to FIGS. 8 and 10, the X-shaft driving connecting shafts 405 are connected to respective first ends of the respective hanger connecting members 371 so that it slides along the respective guide slots 471. A vertically fixed shaft 403 is connected to second ends of the respective hanger connecting members 371. The X-axis driving connecting shafts 405 are connected to the vertical fixed shaft 403 and are located on a central portion of the moving plate 470. The vertically fixed shaft 403 is connected to an X-axis control motor 411, which can be a step motor, to move the shafts 405 in an upward or downward direction.

When the vertical fixed shaft 403 moves downward as shown in FIG. 11a, the X-axis driving connecting shafts 405 move outward in the radial direction. As a result, the hanger connecting members 371 connected to the respective first ends of the X-axis driving connecting shafts 405 slide outward along the respective guide slots 471 provided on the moving plate 470 in the radial direction. Accordingly, the hangers 370 connected to the respective hanger connecting members 371 move outward along the X-axis. At this point, since the plural hangers 370 are connected to the single vertical fixing shaft 403 and the single X-axis control motor 411, the segments 301 and/or 305 defining each of the confinement members of the plasma confining portion 300, synchronously move along the X-axis.

Likewise, when the vertically fixed shaft 403 moves upward as shown in FIG. 11a, the X-axis driving connecting shafts 405 move inward in the radial direction. As a result, the hanger connecting members 371 connected to the respective first ends of the X-axis driving connecting shafts 405 slide inward along the respective guide slots 471 provided on the moving plate 470 in the radial direction. Accordingly, the hangers 370 connected to the respective hanger connecting members 371 move inward along the X-axis.

Referring to FIG. 12, in order to allow the segments 301 and/or 305 move in the direction of the Y-axis while not moving in the direction of the X-axis, Y-axis driving connecting shafts 404 is provided for transmitting torque of a Y-axis control motor 451. Shaft 404 is formed of a step motor which is connected to the moving plate 470. For example, first ends of the Y-axis driving shafts 404 are connected to an inner circumference of the moving plate 470 and the Y-axis control motor 451 is connected to second ends of the Y-axis driving shafts 404. In this way, the moving plate 470 can move in the direction of the Y-axis.

Referring to FIGS. 10 and 12, the Y-axis control motor 451 and the X-axis control motor 411 are designed to independently operate. For example, the Y-axis control motor 451 may be disposed under the X-axis control motor 411.

Referring to FIGS. 5, 7 and 12, by moving the moving plate 470 in the direction of the Y-axis, the arc-shaped segments 301 and/or 305 are synchronously moved in the direction of the Y-axis. Accordingly, as shown in FIG. 7, the distances between the confinement members 310, 330 and 350 can be adjusted to a plurality of positions along the Y-axis.

According to the above-described present invention, since a plasma confining portion is formed by a plurality of arc-shaped segments arranged in a ring-like array, a wafer area corresponding to the plasma confinement area, or a range in a direction of an X-axis, can be varied. That is, while the prior art fixed ring structure cannot vary the plasma confinement area in the direction of the X-axis, the ring-like array of the present invention makes it possible to vary the plasma confinement area in the direction of the X-axis.

As a semiconductor device is increasingly integrated, a multi-layer structure is applied to a substrate. Therefore, different process properties are required for each layer, complicating the semiconductor formation process. In addition, as a process window margin is tightened, a different process may need to be applied for each layer that is to be etched.

The prior processing system having the fixed confining ring structure cannot fulfill the above-described tendency. However, since the inventive processing system employing a variable plasma confining portion is designed to vary a range in the direction of the X-axis or the wafer area corresponding to the plasma confinement area, the process applicability can be improved to fulfill the above-described current tendency. In the present invention, since the plasma confinement area as well as the pressure parameter in the plasma confinement area can be controlled, it is very effective to provide optimized solution for process conditions required for each layer.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A plasma processing system comprising:
   a plasma processing chamber;
   a plasma confining portion for defining a plasma confined area in the processing chamber, the plasma confining portion comprising a plurality of spaced apart segments arranged to form a structural array; and
   an X-axis control portion for moving the plasma confining portion in a direction to expand or contract the plasma confined area.

2. The plasma processing system of claim 1, wherein the plurality of spaced apart segments comprises a plurality of arc-shaped segments arranged to form a ring-like structural array; and the X-axis control portion moves the plasma confining portion in a radial direction to expand or contract the plasma confined area.

3. The plasma processing system of claim 1, wherein the plurality of spaced apart segments comprises a plurality of confining members disposed one above the other in a vertical plane and spaced apart from each other.

4. The plasma processing system of claim 1, further comprising hangers for connecting the respective spaced-apart segments to the X-axis control portion.

5. The plasma processing system of claim 1, further comprising a Y-axis control portion for vertically moving the plasma confining portion for controlling the pressure in the plasma confined area.

6. The plasma processing system of claim 1, further comprising a plurality of auxiliary segments disposed around the structural array, said auxiliary segments being arranged to shield gaps defined between the spaced-apart segments, the auxiliary segments being spaced at a distance from the spaced-apart segments.

7. A plasma processing system comprising:
   a plasma processing chamber;
   a plasma confining portion for defining a plasma confined area in the processing chamber comprising a plurality of confining members disposed one above another in a vertical plane and spaced away from each other, each of the confining members having a plurality of spaced apart segments arranged in a structural array; and
   an X-axis control portion for moving the plasma confining portion in a direction to expand or contract the plasma confined area.

8. The plasma processing system of claim 7, wherein the plurality of confining members comprises a plurality of arc-shaped segments arranged to form a ring-like structural array; and the X-axis control portion moves the plasma confining portion in a radial direction to expand or contract the plasma confined area.

9. The plasma processing system of claim 7, further comprising hangers for connecting the respective spaced apart segments to the X-axis control portion.

10. The plasma processing system of claim 7, further comprising a Y-axis control portion for vertically moving the plasma confining portion to control pressure in the plasma confined area.

11. The plasma processing system of claim 7, further comprising a plurality of auxiliary segments disposed around the structural array defined by the spaced apart segments to shield gaps defined between the spaced apart segments, the auxiliary segments being spaced away from the spaced apart segments.

12. A plasma processing system comprising:
a plasma processing chamber;
a plasma confining portion for defining a plasma confined area in the processing chamber comprising a plurality of confining members disposed one above another in a vertical plane, and spaced apart from each other, each of the confining members having a plurality of segments arranged in a structural array;
an X-axis control portion for moving the plasma confining portion in a direction for expanding or contracting the plasma confined area; and
a Y-axis control portion for upwardly and downwardly moving the plasma confining portion to control pressure in the plasma confined area.

13. The plasma processing system of claim 12, further comprising hangers for connecting the respective segments to the X-axis control portion and the Y-axis control portion.

14. The plasma processing system of claim 12, further comprising a plurality of auxiliary segments disposed around the structural array defined by the segments, to shield gaps defined between the segments, the auxiliary segments being spaced apart from the segments.

15. A plasma processing system comprising:
a plasma processing chamber;
a plasma confining portion for defining a plasma area in the processing chamber comprising a plurality of confining members disposed one above another in a vertical plane, and spaced apart from each other, each of the confining members having a plurality of arc-shaped segments arranged in a ring-like array, and a plurality of segments disposed around the ring-like array defined by the arc-shaped segments to shield gaps defined between the arc-shaped segments, the auxiliary segments being spaced apart from the arc-shaped segments;
an X-axis control portion for moving the plasma confining portion in a radial direction to expand or contract the plasma confined area; and
a Y-axis control portion for vertically moving the plasma confining portion to control pressure in the plasma confined area.

16. The plasma processing system of claim 15, further comprising hangers for connecting the respective arc-shaped segments and auxiliary segments to the X-axis control portion and the Y-axis control portion.

17. A plasma processing system comprising:
a plasma processing chamber;
a plasma confining portion for defining a plasma confined area in the processing chamber comprising a plurality of confining members disposed one another in a vertical plane and spaced away from each other, each of the confining members having a plurality of spaced apart segments arranged in a structural array;
a plurality of hangers supporting the respective spaced apart segments;
a moving plate supporting the hangers, said moving plate defining a plurality of guide slots, the hangers penetrating the guide slots;
a plurality of hanger connecting members having first ends connected to the respective hangers to be slidable along the guide slots;
a vertical fixing shaft to which second ends of the hanger connecting members are connected;
an X-axis control motor for sliding the hanger connecting members moving the vertical fixing shaft in a vertical direction and synchronously moving the spaced apart segments in a direction for expanding and contracting the plasma confined area; and
a Y-axis control motor for vertically moving the spaced apart segments by vertically moving the moving plate to control pressure in the plasma confined area.

18. The plasma processing system of claim 17, further comprising a plurality of auxiliary segments disposed around the structural array defined by the spaced apart segments to shield gaps defined between the arc-shaped segments, the auxiliary segments being spaced apart from the spaced apart segments.

19. The plasma processing system of claim 17, wherein the plurality of spaced apart segments comprises a plurality of arc-shaped segments arranged to form a ring-like structural array; and the X-axis control portion moves the plasma confining portion in a radial direction to expand or contract the plasma confined area.

* * * * *

UNITED STATES PATENT AND TRADEMARK OFFICE
CERTIFICATE OF CORRECTION

PATENT NO. : 7,429,306 B2 Page 1 of 1
APPLICATION NO. : 11/144386
DATED : September 30, 2008
INVENTOR(S) : Beom-Suk Ma It is certified that error appears in the above-identified patent and that said Letters Patent is hereby corrected as shown below:

Column 9, line 44, the words "plasma area" should read -- plasma confined area --;
Column 10, line 17, the word "one" should read -- one above --.

Signed and Sealed this

Seventeenth Day of February, 2009

JOHN DOLL
*Acting Director of the United States Patent and Trademark Office*